United States Patent [19]
Ishibashi et al.

[11] Patent Number: 5,180,476
[45] Date of Patent: Jan. 19, 1993

[54] METHOD FOR PRODUCING TRANSPARENT CONDUCTIVE FILMS

[75] Inventors: Satoru Ishibashi, Chiba; Kyuzo Nakamura; Yasushi Higuchi, both of Yachimatamachi; Takashi Komatsu, Narita; Yuzo Murata, Narutoumachi; Yoshifumi Ota, Yachimatamachi, all of Japan

[73] Assignee: Nihon Shinku Gijutsu Kabushiki Kaisha, Chigasaki, Japan

[21] Appl. No.: 660,840

[22] Filed: Feb. 26, 1991

[30] Foreign Application Priority Data

Feb. 27, 1990 [JP] Japan .................. 2-44558

[51] Int. Cl.$^5$ ............................. C23C 14/35
[52] U.S. Cl. ............... 204/192.29; 204/298.08; 204/298.19; 204/298.25
[58] Field of Search .............. 204/192.29, 298.08, 204/298.16–298.22, 298.25

[56] References Cited

U.S. PATENT DOCUMENTS

| | | | |
|---|---|---|---|
| 4,849,081 | 7/1989 | Ross | 204/192.15 |
| 5,026,471 | 6/1991 | Latz et al. | 204/298.19 |

FOREIGN PATENT DOCUMENTS

| | | |
|---|---|---|
| 60-132319(A) | 7/1985 | Japan . |
| 63-109164 | 5/1988 | Japan .................. 204/298.08 |
| 2-232358(A) | 9/1990 | Japan . |

Primary Examiner—Aaron Weisstuch
Attorney, Agent, or Firm—Armstrong & Kubovcik

[57] ABSTRACT

A method of producing by sputtering an In-O, Sn-O, Zn-O, Cd-Sn-O or Cd-In-O based transparent conductive film according to the present invention uses the addition of a donor element, if needed. The sputtering is carried out by maintaining an intensity of a magnetic field on a surface of a target at 600 Oe or greater as well as by charging the target with a DC electric field superimposed by an RF electric field. An apparatus for producing an In-O, Sn-O, Zn-O, Cd-Sn-O or Cd-In-O base transparent conductive film uses the addition of a donor element, if needed. The apparatus has a vacuum chamber adapted to support therein a substrate and a target in an opposed relationship for forming by sputtering the transparent conductive film on the substrate by plasma discharge generated therebetween. The apparatus has a device for forming a magnetic field having a predetermined intensity of 600 Oe or greater on a surface of the target, a DC power supply for charging the target with a DC electric field, and an RF power supply for charging the target with an RF electric field superimposed on the DC electric field.

3 Claims, 5 Drawing Sheets

METHOD FOR PRODUCING TRANSPARENT CONDUCTIVE FILMS

BACKGROUND OF THE INVENTION

This invention relates to a method and an apparatus for producing a transparent conductive film and in particular to a method and an apparatus for producing an In-O, Sn-O, Zn-O, Cd-Sn-O or Cd-In-O based transparent conductive film used as an electrode for such devices as a liquid crystal display element, a solar battery or the like.

There are conventionally known processes for producing this kind of transparent conductive film such as coating, vacuum deposition, gas-phase reaction methods, as well as sputtering methods that include the DC or RF double-pole sputtering method and the DC or RF magnetron sputtering method. Among these producing processes, the sputtering methods are superior to the other producing methods in that a transparent conductive film of relatively low electrical resistance is easily obtained and that this transparent conductive film can be formed uniformly and controllably on a large-sized substrate with good reproducibility or repeatability. Among the different sputtering methods, the magnetron sputtering method which utilizes plasma confinement by a magnetic field on a surface of a target is generally used because it has a high film-forming speed and is better for mass production. Further, for an electric power supply for generating electric discharging, a DC power supply is normally used because it is superior in cost, uniformity of electric discharging, film-forming speed and the like.

When producing a transparent conductive film using one of the sputtering methods, the temperature of the substrate and the partial pressure of oxygen are factors which affect the electrical resistivity of the transparent conductive film. As regards the substrate temperature, it is known that the higher the substrate temperature, the lower the electrical resistivity of the resulting film. On the other hand, as regards the partial pressure of oxygen, it is known that with a lower oxygen partial pressure, the density of carriers is higher, and the mobility is lower because there are many vacancies of oxygen which would normally act as donors. With a higher oxygen partial pressure, the density of carriers is lower and the mobility is higher. Thus, there is an optimum partial pressure of oxygen that will result in an electrical resistivity of a minimum value from an even balance of the density and the mobility. Thus, it was a practice in the prior art sputtering methods to produce a transparent conductive film having a lower electrical resistivity wherein parameters of the substrate temperature and the partial pressure of oxygen were controlled.

However, it is required in present-day display elements that the transparent electrode have a lower electrical resistance because of enlargements in the display screen size. The prior art sputtering methods can no longer meet the requirements. Especially, in a display element of a simple matrix drive system, a transparent conductive film is used in the scanning signal electrode. If the electric resistance of the transparent conductive film is high, the image quality deteriorates. Therefore, the electrical resistance of the transparent conductive film must be low. In addition, in full color STN display elements which have attracted attention recently, a transparent conductive film is normally formed on an organic color filter. The temperature of forming the transparent conductive film is limited to about 160° to 200° C. due to the heat-resisting temperature of the filter, and thus forming the transparent conductive film at a lower temperature becomes necessary.

The inventors of this invention already found out, as disclosed in Japanese Patent Application No. 150086/1989 (Japanese Published Unexamined Patent Application No. 232358/1990), that the factors largely affecting the electrical resistivity in producing a transparent conductive film by the sputtering methods are the discharging voltage during sputtering, along with the above-described substrate temperature and the partial pressure of oxygen. Consequently, a method of producing a transparent conductive film was proposed in which a transparent conductive film of lower resistance can be obtained by sputtering at a low sputtering voltage. This method is based on the following idea. When a transparent oxide conductive film is formed by a sputtering method, anions of oxygen are generated by the ionization of oxygen in the introduced oxygen gas or in the target composition. These anions smash into the substrate, thereby causing micro-damage to the transparent conductive film that is being formed and consequently deteriorating the film characteristics such as resistance or the like. Since these anions are accelerated by an electric field generated by the negative electric potential of the target, the degree to which the formed transparent conductive film deteriorates is proportional to the energy of the anions (i.e., the negative electric potential of the target).

Here, the target during sputtering is understood to have a negative electric potential and an absolute value thereof is called a sputtering voltage or a discharging voltage.

In the producing method of the above-described patent application, the intensity of a magnetic field on the surface of the target was increased and the density of plasma produced by magnetron discharging was increased, resulting in a decrease or lowering in the electric discharging voltage. By lowering the sputtering voltage down to about 250V in the above-described method while that in the conventional DC magnetron sputtering method is about 400V (the target electric potential being $-400V$), it was possible to largely decrease the electrical resistivity of the formed transparent conductive films which were produced at various substrate temperatures ranging from room temperature to 400° C. or above. The electrical resistivity of the transparent conductive film linearly dropped relative to the sputtering voltage within the sputtering voltage range of 400 to 250V. It was expected that the electrical resistivity would further lower also in the range of sputtering voltage of 250V or below.

However, in the above-described method of controlling the sputtering voltage by varying only the intensity of the magnetic field, it is difficult to lower the sputtering voltage below 250V, as can be seen form FIG. 1. FIG. 1 shows the relationship between the intensity of the magnetic field on the surface of the target and the discharging voltage during sputtering. Namely, the sputtering voltage effectively decreases to about 1000 Oe with the increase in the intensity of the magnetic field. Above 1000 Oe, however, the decrease in the sputtering voltage is almost saturated, and the sputtering voltage reaches about 250V at 1600 Oe. As a consequence, even through the intensity of the magnetic field is further increased, no further decrease in the sputtering voltage can be expected.

Therefore, by eliminating the problems associated with the conventional methods, the present invention can provide a method of and an apparatus for producing a transparent conductive film with a still lower electrical resistance.

SUMMARY OF THE INVENTION

Upon diligent studies to attain the above-described object, the inventors of this invention have found that the sputtering voltage can further be lowered or decreased by superimposing an RF electric field on a DC electric field used during discharging, while at the same time, increasing the intensity of the magnetic field on the surface of the target.

This invention has been made on the basis of the above-described finding. This invention is a method of producing a transparent conductive film by sputtering an In-O, Sn-O, Zn-O, Cd-Sn-O or Cd-In-O based transparent conductive film that has a donor element added if required, wherein the sputtering is carried out by maintaining the intensity of a magnetic field on a surface of a target at 600 Oe or greater, while charging the target with a DC electric field superimposed by an RF electric field.

As explained above with reference to FIG. 1, when only the magnetic field is varied, the lowering or decrease in the sputtering voltage is saturated at around 1000 Oe. Consequently, it is difficult to lower the sputtering voltage below 250V. In order to further lower the sputtering voltage, the density of plasma may be increased. Also, by increasing the density of plasma, the plasma impedance is lowered and the discharging voltage is lowered. The invention is directed to lowering the sputtering voltage below 250V by superimposing, as a means of increasing the density of plasma, the RF electric field on the Dc electric field used for generating the discharging voltage. Here, the superimposition of the RF electric field is effective when the intensity of the magnetic field on the surface of the target is 600 Oe or more. When the intensity of the magnetic field is below 600 Oe, the sputtering voltage increases through the superimposition of the RF electric field. Therefore, in superimposing the high-frequency electric field, the intensity of the magnetic field on the surface of the target must be maintained at 600 Oe or greater.

As the above-described target, an In, Sn, Zn, Cd-Sn, Cd-In based metallic target or the like or a respective sintered oxide based target with an addition of a donor element, if required, is used. As an element to be added, Sn is generally used for an In-O based target, Sb for an Sn-O based target, and In, Al, Si or the like for a Zn-O based target, respectively. Among these targets, the In-O based target with an addition of a small amount of Sn (hereinafter called ITO) results in a film having the lowest resistance value. In addition, the resultant film has superior etching characteristics. It is therefore preferable to use the ITO target.

The target may be a sintered oxide target, and a DC power supply can be used as the electric discharging power supply because the sintered oxide target itself has a high electrical conductivity.

As a sputtering gas, a mixture of an inert gas such as Ar or the like with oxygen may be used. When Ar is used as the inert gas, it is preferable to make the gas mixture pressure in the order of about $10^{-3}$ Torr, and the oxygen partial pressure in the order of about $10^{-5}$ Torr.

The apparatus for producing a transparent conductive film according to another aspect of this invention is directed to producing an In-O, Sn-O, Zn-O, Cd-Sn-O or Cd-In-O based transparent conductive film with the addition of a donor element, when required. The apparatus has a vacuum chamber adapted to support therein a substrate and a target in opposed relationship to one another for sputtering the transparent conductive film onto the substrate by plasma discharge generated therebetween. The apparatus includes means for forming a magnetic field having a predetermined intensity of 600 Oe or greater on a surface of the target, DC power supply means for supplying the target with a DC electric field, and RF power supply means for supplying the target with a RF electric field superimposed on the DC electric field.

According to this invention, it is possible to sputter at a sputtering voltage of 250V or less. Therefore, the energy of the oxygen anions incident on the substrate is kept low, resulting in less damage to the transparent conductive film. A transparent conductive film of a lower electrical resistance can thus be obtained.

BRIEF DESCRIPTION OF THE DRAWINGS

The above and other objects and the attendant advantages of this invention will become readily apparent by reference to the following detailed description when considered in conjunction with the accompanying drawings wherein.

DETAILED DESCRIPTION OF A PREFERRED EMBODIMENT

A method and an apparatus for producing a transparent conductive film according to a preferred embodiment of this invention will now be described with reference to the above-described accompanying drawings.

Figure 1:
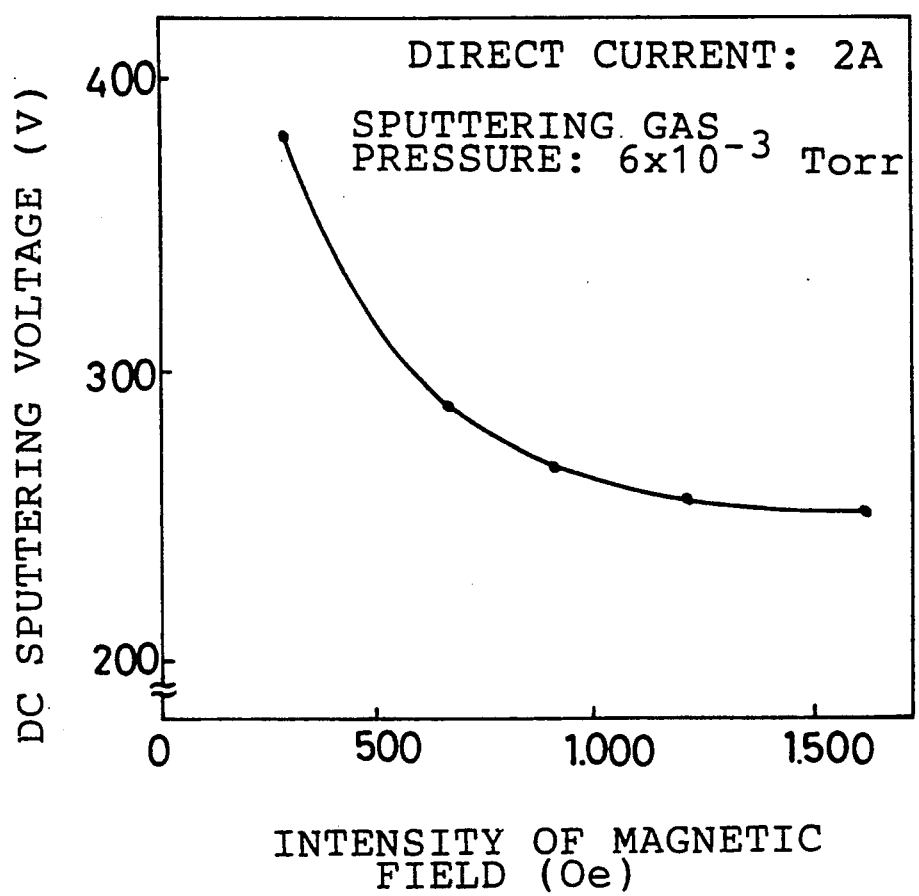
FIG. 1 is a characteristic graph showing the relationship between the intensity of magnetron magnetic field and the DC sputtering voltage.
Figure 2:
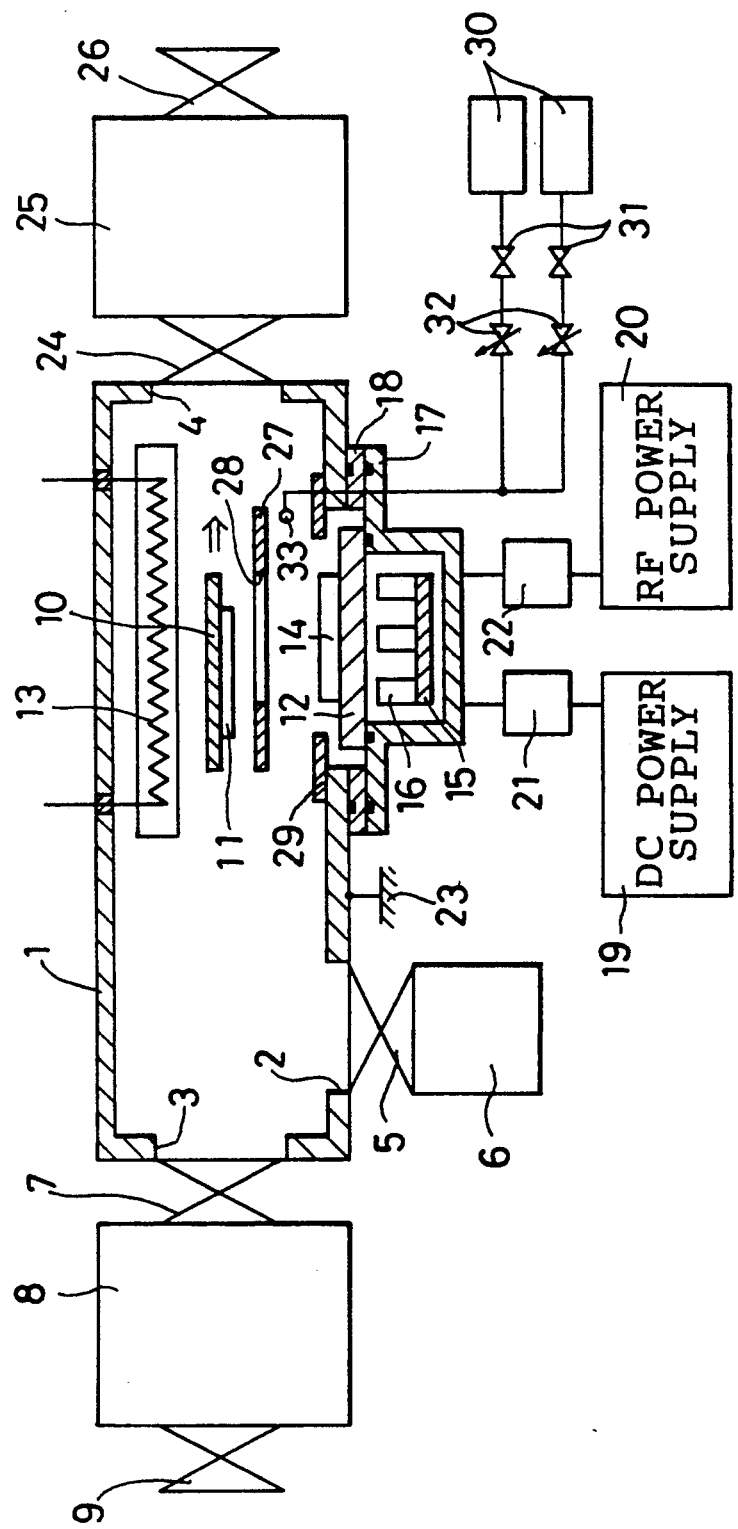
FIG. 2 is a sectional view of an apparatus for producing a transparent conductive film according to one embodiment of this invention.

FIG. 2 is a sectional view of an apparatus for producing a transparent conductive film according to one embodiment of this invention. In the figure, numeral 1 denotes a vacuum chamber (i.e., a sputtering chamber). In this sputtering chamber 1, there are provided three openings (i.e., an exhaust port 2, a loading port 3 and an unloading port 4). The exhaust port 2 is connected to an evacuating means 6 such as a cryopump or the like via a valve 5 so that the amount of vacuum in the sputtering chamber 1 can be adjusted.

The loading port 3 is connected to a loading chamber 8 via a valve 7. The loading chamber 8 is also provided at its loading port with a valve 9. The sputtering chamber 1 is connected to a sputtering gas supply source 30, from which a sputtering gas such as argon and oxygen is supplied independently or as a mixture gas through stop valves 31, mass flow controllers 32 and a nozzle 33. The partial pressures of the above-described argon gas and oxygen gas are respectively controlled at, for example, of $10^{-3}$ Torr for argon gas and $10^{-5}$ Torr for oxygen gas.

In the sputtering chamber 1, there are provided in parallel opposing relationship a substrate 11 supported on a substrate holder 10, and a sputter cathode 12. The substrate holder 10 is either fixed or so arranged as to be linearly movable inside the sputtering chamber 1 while maintaining a parallel relationship with the sputter cathode 12. Although not illustrated, a means for linearly driving the substrate holder as described above is also provided.

Behind the substrate 11, there is provided a heater 13 to control the substrate temperature in the film-forming process to a predetermined temperature. The sputter cathode 12 is water-cooled, and on the front surface thereof there is fixed a target 14 with a brazing material. In the rear portion o the sputter cathode 12, there is disposed via an insulating plate 18 a cathode enclosure 17 which contains therein a permanent magnet 16 supported on a pole piece 15. This permanent magnet 16 s for generating a magnetic field for magnetron discharging. The intensity of the magnetic field on the surface of the target 14 is adjusted by varying the distance between the permanent magnet 16 and the target 14. The intensity of the magnetic field is adjustable up to a maximum of 1600 Oe.

As an electric power supply for plasma discharging, a DC power supply means 19 as a main power supply and an RF (e.g., 13.56MHz) power supply means 20 as an auxiliary power supply are used. The DC power supply means 19 is connected, via an RF filter 21 for preventing the incoming of the RF electric field, and the RF power supply means 20 is connected via a matching box 22, respectively, to the cathode enclosure 17 and correspondingly to the sputter cathode 12. The sputtering chamber 1 is grounded as shown by numeral 23. By setting the sputtering chamber 1 at earth potential, the cathode enclosure 17 is charged with a negative voltage so that DC magnetron sputtering can be carried out inside the vacuum chamber 1.

The unloading port 4 of the vacuum chamber 1 is connected to an unloading chamber 25 via a valve 24. The unloading chamber 25 is also provided at its unloading port with a valve 26.

The substrate 11 is mounted on the substrate holder 10 from the side of the loading chamber 8, and the substrate having a transparent conductive film formed on the surface thereof is unloaded through the unloading chamber 25.

In the figure, numeral 27 denotes an anti-deposition plate and numeral 29 denotes a grounded shield.

EXPERIMENT EXAMPLE 1

Figure 3:
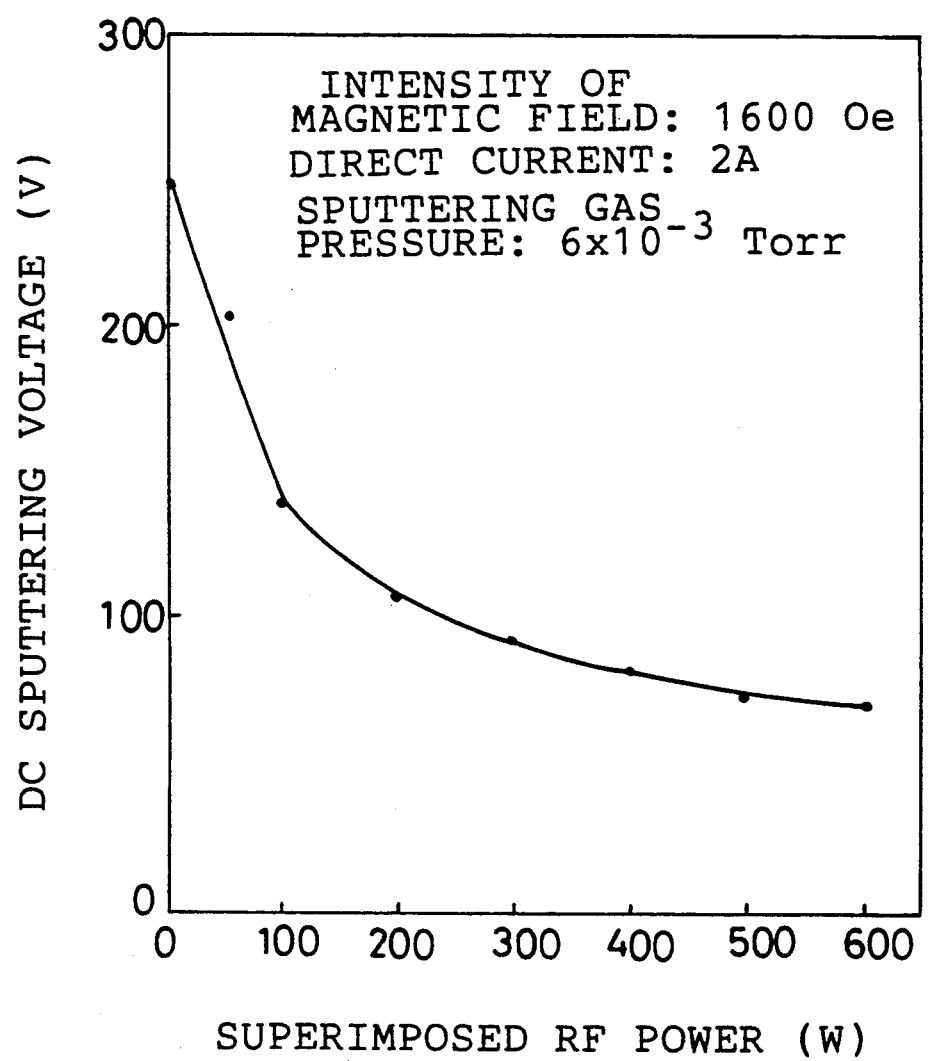
FIG. 3 is a characteristic graph showing the relationship between the superimposed RF electric power and the DC sputtering voltage.

In the apparatus as shown in FIG. 2, a sintered target of $In_2O_3$ with an addition of 10% by weight of $SnO_2$ was used. The distance between the target and the substrate was set at 80 mm, the intensity of the magnetic field was set at 1600 Oe, and the DC power supply was controlled to maintain a constant current of 2A. Under the above conditions, an RF electric field of 13.56MHz was superimposed, while varying the electric power, on the discharging by the DC electric field. The DC sputtering voltage at this time was measured. In this experimental example, a sputtering gas mixture of argon and oxygen was introduced into the sputtering chamber 1, and the total pressure therein was adjusted to $6 \times 10^{-3}$ Torr. The results are shown in FIG. 3. As can be seen from the graph in FIG. 3, as compared with the sputtering voltage of 250V without superimposition of the high-frequency electric field, the sputtering voltage decreased with an increase in RF electric power when the high-frequency electric field was by superimposed. The sputtering voltage decreased to 70V at the time of the superimposition of an RF electric power of 600W.

Figure 4:
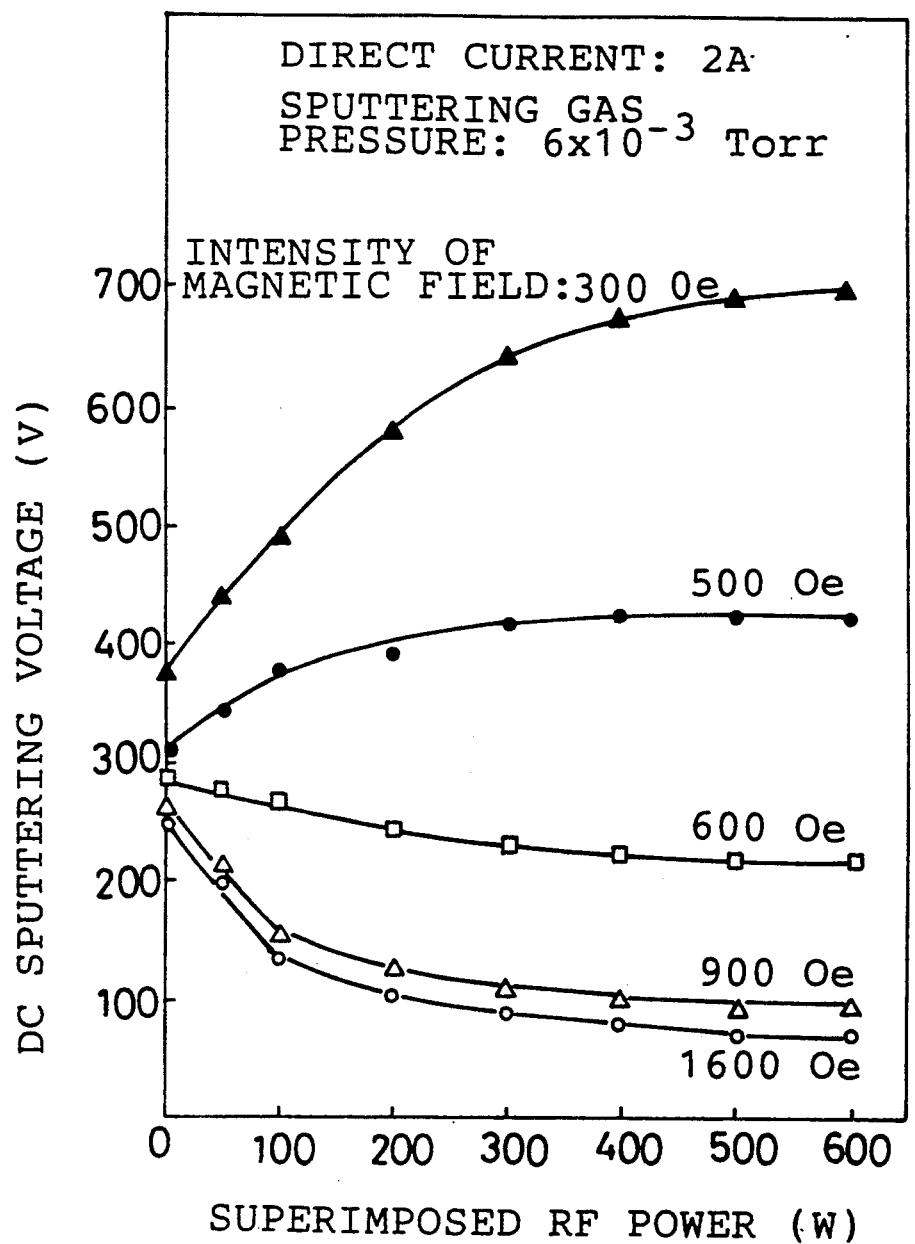
FIG. 4 is a graph showing the relationship between the superimposed RF electric power and the DC sputtering voltage at varying intensities of the magnetron magnetic field.

The DC sputtering voltage was also measured when the intensity of the magnetic field was varied within the range of 300 and 1600 Oe and, at the same time, when the superimposed RF electric power was varied. The results are shown in FIG. 4. As can be seen from the graph of this figure, when the intensity of the magnetic field was 600 Oe or greater, the DC sputtering voltage was lowered by the superimposition of the RF electric field. However, when the intensity of the magnetic field was 500 Oe or below, the sputtering voltage increased as a result of the superimposition of the RF electric field. Therefore, in order to lower the sputtering voltage by superimposing the RF electric field, the intensity of the magnetic field on the surface of the target must be maintained at 600 Oe or greater.

EXPERIMENT EXAMPLE 2

Inside the sputtering chamber 1 of the above-described apparatus, there were disposed an oxide target 14 (125 mm × 406 mm in size) of $In_2O_3$ with an addition of 10% by weight of $SnO_2$ and a substrate 11 made of a transparent glass (Coring No. 7059, 1.1 mm in thickness) A sputtering gas mixture of argon and oxygen was introduced into the sputtering chamber 1, and the total pressure therein was adjusted to $6 \times 10^{-3}$ Torr. The sputtering voltage was varied, in the range of 250V and more, only by varying the intensity of the magnetic field. The sputtering voltage was varied in the range of 250V or less by superimposing the RF electric field while maintaining the intensity of the magnetic field at 1600 Oe.

Here, since the optimum value of the electrical resistivity of the ITO film is dependent on the partial pressure of oxygen, the electrical resistivity of the ITO film was measured by varying the partial pressure of oxygen in the order of $10^{-5}$ Torr under the respective conditions. Thus, an optimum value was achieved.

Film forming was carried out by moving the substrate from the loading port 3 towards the unloading port 4 at a steady speed, while maintaining the substrate temperature at 200° C. under the above described conditions.

Figure 5:
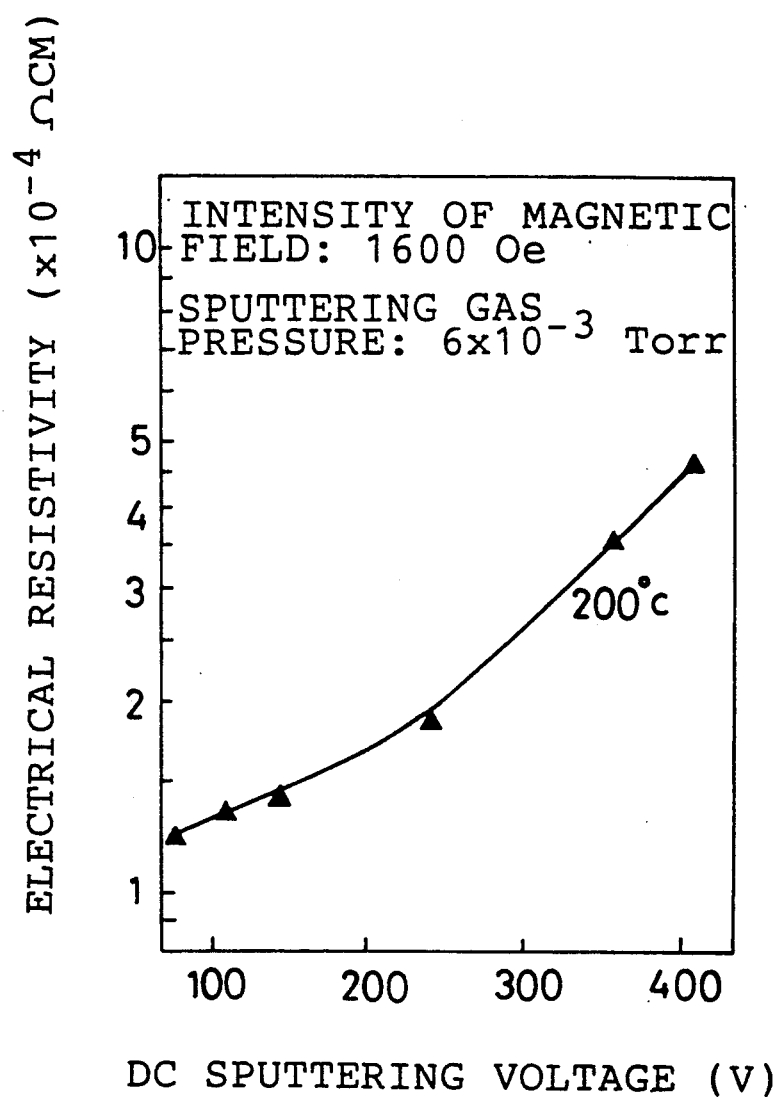
FIG. 5 is a graph showing the relationship between the DC sputtering voltage and the electrical resistivity of ITO transparent conductive film.

FIG. 5 shows the relationship between the sputtering voltage and the electrical resistivity of the ITO film obtained. As can be seen from this figure, the electrical resistivities of the ITO film was as low as $1.9 \times 10^{-4}$ $\Omega$cm at a sputtering voltage 250V and $1.25 \times 10^{-4}\Omega$cm at a sputtering voltage of 80V, compared to $4.5 \times 10^{-4}\Omega$cm at a sputtering voltage of 420V.

The reason for these low sputtering voltages is considered to be as follows. In this method of producing a transparent conductive film, by sputtering at a low sputtering voltage of 250V or less (i.e., at a target electric potential of $-250V$ or less), the energy of the anions incident on the transparent conductive film which damages the conductive film and which causes the rise in the electric resistance, is reduced. As a consequence, in the ITO film, for instance, divalent In or Sn which serves as an acceptor decreases and the carrier density increases, thereby lowering the electrical resistivity of the ITO film.

In the above embodiment, an ITO based target was used. As a target, an SnO-based or a ZnO-based sintered body may also be used as well. When a transparent conductive film is formed by conventional methods using this SnO-based or ZnO-based sintered body, the electrical resistance is deteriorated by the incidence of the anions of oxygen or the like. However, the electrical resistivity of the formed transparent conductive film can be lowered by lowering the sputtering voltage, as in the case of using the above-described ITO based target.

According to this invention, as described above, since it is possible to decrease the incident energy of the anions which may cause an increase in the resistance of the transparent conductive film, a transparent conductive film with a lower resistance than that of the conventional sputtering method can be obtained.

For example, when an ITO transparent conductive film was produced on a substrate at 200° C., in the conventional sputtering method (sputtering voltage about 400V) it was only possible to obtain a transparent conductive film with an electrical resistivity in the order of 4 to $5 \times 10^{-4}$ $\Omega$cm. In contrast, when this invention was used, it was possible to obtain a transparent conductive film with an electrical resistivity as low as about $1.25 \times 10^{-4}$ $\Omega$cm, about ⅓ of the value obtained by the conventional method.

It is readily apparent that the above-described invention has the advantage of wide commercial utility. It should be understood that the specific form of the invention hereinabove described is intended to be representative only, as certain modifications within the scope of these teachings will be apparent to those skilled in the art.

Accordingly, references should be made to the following claims in determining the full scope of the invention.

What is claimed is:

1. A method of producing an In-O, Sn-O, Zn-O, Cd-Sn-O or Cd-In-O based transparent conductive film with an optional additional of a donor element, said method comprising the steps of:

maintaining an intensity of a magnetic field on a surface of a target at a level of at least 600 Oe; and sputtering the target so as to form the transparent conductive film on a substrate by charging the target, simultaneously with said maintaining of the magnetic filed intensity, with a DC electric field superimposed with an RF electric field so as to lower the sputtering voltage to 250 volts or less.

2. A method as set forth in claim 1, wherein the target comprises at least one material selected from the group consisting of In, Sn, Zn, Cd-Sn and Cd-In based metals, and In, Sn, Zn, Cd-Sn and Cd-In sintered oxides.

3. A method as set forth in claim 2, wherein the material for the target has a donor element added therein, the donor element comprising at least one material selected from the group consisting of Sn, Sb, In, Al, and Si.

* * * * *